(12) United States Patent
Park et al.

(10) Patent No.: US 7,091,571 B1
(45) Date of Patent: Aug. 15, 2006

(54) IMAGE SENSOR PACKAGE AND METHOD FOR MANUFACTURE THEREOF

(75) Inventors: Sung Soon Park, Seoul (KR); Jin Seong Kim, Kyounggi-do (KR); Young Ho Kim, Seoul (KR)

(73) Assignee: Amkor Technology, Inc., Chandler, AZ (US)

(*) Notice: Subject to any disclaimer, the term of this patent is extended or adjusted under 35 U.S.C. 154(b) by 26 days.

(21) Appl. No.: 10/735,184

(22) Filed: Dec. 11, 2003

(51) Int. Cl.
*H01L 31/0232* (2006.01)
*H01L 31/0203* (2006.01)

(52) U.S. Cl. .................. 257/432; 257/433; 257/434
(58) Field of Classification Search ............ None
See application file for complete search history.

(56) References Cited

U.S. PATENT DOCUMENTS

| | | | |
|---|---|---|---|
| 3,880,528 A | 4/1975 | Petersen et al. | 356/225 |
| 4,055,761 A | 10/1977 | Shimomura | 250/239 |
| 5,444,520 A | 8/1995 | Murano | 355/229 |
| 5,821,532 A | 10/1998 | Beaman et al. | 250/239 |
| 6,011,661 A | 1/2000 | Weng | 359/819 |
| 6,037,655 A | 3/2000 | Philbrick et al. | 257/680 |
| 6,384,472 B1 | 5/2002 | Huang | 257/680 |
| 6,455,774 B1 | 9/2002 | Webster | 174/52.4 |
| 6,483,101 B1 | 11/2002 | Webster | 250/216 |
| 6,727,431 B1* | 4/2004 | Hashimoto | 174/52.2 |
| 6,767,753 B1 | 7/2004 | Huang | 438/25 |
| 6,845,664 B1* | 1/2005 | Okojie | 73/431 |
| 6,882,020 B1* | 4/2005 | Kobayashi et al. | 257/433 |
| 2004/0080658 A1* | 4/2004 | Cambou et al. | 348/340 |
| 2004/0159927 A1* | 8/2004 | Loo et al. | 257/678 |
| 2005/0036778 A1* | 2/2005 | DeMonte | 396/89 |

FOREIGN PATENT DOCUMENTS

| | | |
|---|---|---|
| GB | 1022329 | 7/1964 |
| WO | WO 93/22787 | 11/1993 |

* cited by examiner

*Primary Examiner*—David E. Graybill
(74) *Attorney, Agent, or Firm*—Gunnison, McKay & Hodgson, L.L.P.; Serge J. Hodgson

(57) ABSTRACT

Disclosed is an image sensor package and a method for manufacturing the same. The image sensor package comprises an image sensor die, a substrate, a support wall having screw threads on the outer peripheral surface thereof and a mount into which a barrel including a plurality of lenses and an infrared blocking glass is mounted. The screw threads formed on the outer peripheral surface of the support wall are engaged with those formed on the inner peripheral surface of the mount. At least one passive element is provided on the substrate at the outer peripheral side of the support wall, thereby increasing the packaging density of the image sensor package.

20 Claims, 12 Drawing Sheets

IMAGE SENSOR PACKAGE AND METHOD FOR MANUFACTURE THEREOF

BACKGROUND OF THE INVENTION

1. Field of the Invention

The present invention relates to an image sensor package and a method for manufacturing the same.

2. Description of the Related Art

Image sensor dies have a wide range of applications, which include applications in toys, digital cameras, camcorders, scanners, medical scopes, surveillance cameras and cellular phones. Generally, image sensor dies are used to process moving pictures or still pictures. Applications in cameras and cellular phones have brought an explosive increase of demand for image sensor dies. It is expected that such image sensor dies will become the most promising market for the next-generation semiconductor industry.

A conventional image sensor package including an image sensor die generally comprises a substrate on which the image sensor die is mounted, a conductive wire for electrically connecting the image sensor die to the substrate, an infrared blocking glass for blocking infrared rays, a barrel transmitting light to the image sensor die and having a plurality of lenses for adjusting a focus distance, and a mount for fixing the barrel to the substrate.

However, the large number of elements complicates the process of manufacturing the conventional image sensor package and increases the cost of manufacture. Specifically, in the conventional image sensor package, the barrel and the infrared blocking glass are provided as separate elements and the infrared blocking glass is independently mounted within the mount, thereby increasing the number of elements and complicating the manufacturing process.

In order to manufacture the conventional image sensor package, equipment for precisely handling a very small infrared blocking glass is necessary. Also, mounting the infrared blocking glass using such equipment prolongs the time of manufacturing.

In addition, when a barrel connecting process is performed over the infrared blocking glass, dust particles may easily lay on the infrared blocking glass. This will reduce the image recognition rate of the image sensor package.

SUMMARY OF THE INVENTION

In accordance with one embodiment of the present invention, disclosed is an image sensor package and a method for manufacturing the same. The image sensor package comprises an image sensor die, a substrate, a support wall having screw threads on the outer peripheral surface thereof and a mount into which a barrel including a plurality of lenses and an infrared blocking glass is mounted. The screw threads formed on the outer peripheral surface of the support wall are engaged with those formed on the inner peripheral surface of the mount. At least one passive element is provided on the substrate at the outer peripheral side of the support wall, thereby increasing the packaging density of the image sensor package.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION

Figure 1:
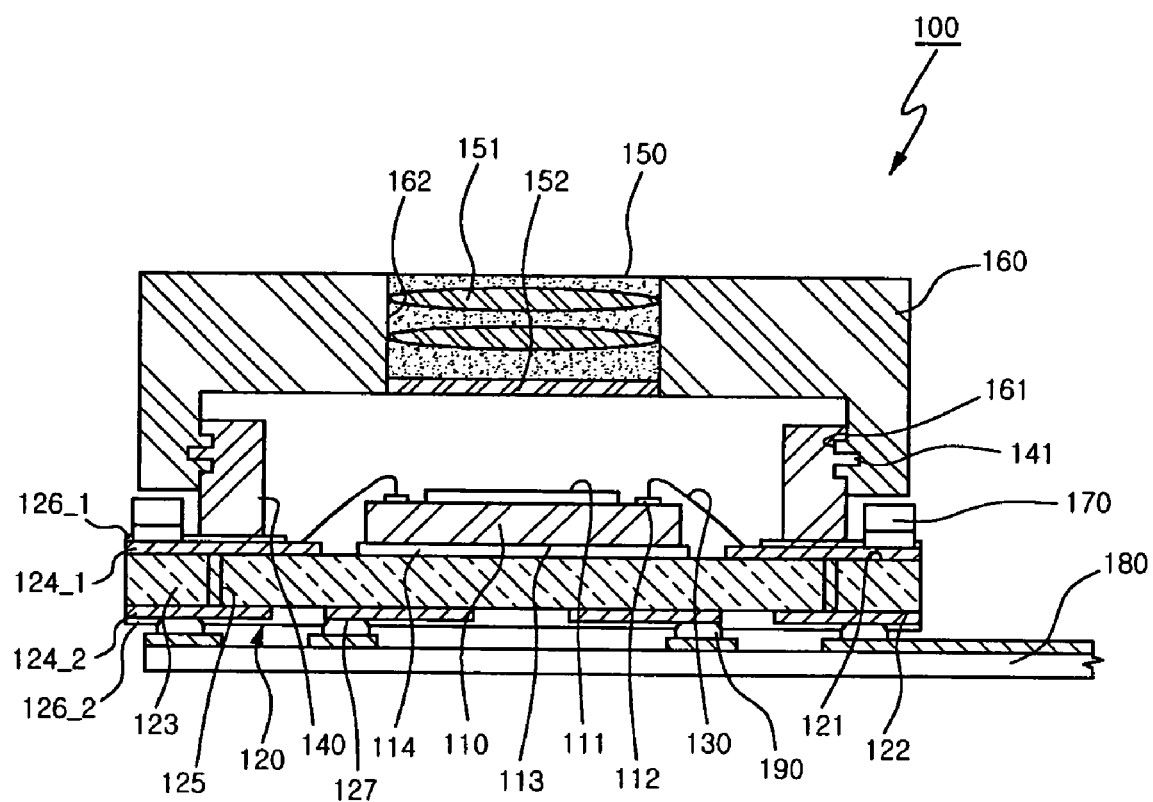
FIG. 1 is a cross-sectional view of an image sensor package constructed in accordance with one embodiment of the present invention.

Referring to FIG. 1, a cross-sectional view of an image sensor package 100 constructed in accordance with one embodiment of the present invention is illustrated.

As shown in the drawing, the image sensor package 100 comprises an image sensor die 110 receiving external light and converting the received light to an electrical signal, a substrate 120 supporting the image sensor die 110 and relaying an electrical signal to or from an external device, a plurality of conductive wires 130 electrically connecting the image sensor die 110 to the substrate 120, a support wall 140 having a predetermined height and formed on the substrate 120 around the periphery of the conductive wires 130 and a mount 160 having a barrel 150 at the center thereof and coupled to the support wall 140.

The image sensor die 110 has an approximately or completely planar photosensing surface 111 which receives external light and converts the received light into an electrical signal and a plurality of bond pads 112 at the peripheral side of the photosensing surface 111. Also, the image sensor die 110 has an approximately or completely planar non-photosensing surface 113 on the side opposite to the photosensing surface 111 and the bond pads 112.

The substrate 120 includes an insulating layer 123 having an approximately or completely planar first surface 121 to which the non-photosensing surface 113 of the image sensor die 110 is adhered by means of an adhesive 114 and an approximately or completely planar second surface 122 on the opposite side thereof. A plurality of electrically conductive patterns 124_1 is formed on the first surface 121 of the insulating layer 123. Also, a plurality of electrically conductive patterns 124_2 is formed on the second surface 122. The electrically conductive patterns 124_1 and 124_2 are connected by conductive vias 125 which penetrate into the insulating layer 123. The first surface 121 and the electrically conductive patterns 124_1, excluding the wire bonding portions, are coated with a first protective layer 126_1. Also, the second surface 122 and the electrically conductive patterns 124_2, excluding the soldering portions, are coated with a second protective layer 126_2. The soldering portions are defined herein as ball lands 127.

The plurality of conductive wires 130 electrically connect the bond pads 112 formed on the image sensor die 110 to the substrate 120, and more particularly to the electrically conductive patterns 124_1 formed on the first surface 121 of the insulating layer 123. The conductive wires 130 may be of aluminum, copper, gold, silver or an equivalent thereof. The material of the conductive wires 130 is not to be limited herein.

The support wall 140 having a predetermined height is formed on the first protective layer 126_1 of the substrate 120 around the periphery of the conductive wires 130. The support wall 140 is made of a non-conductive material. Preferably, the support wall 140 should be higher than the loop height formed by the conductive wires 130. Also, the support wall 140 has a plurality of screw threads 141 on the outer peripheral surface thereof.

The mount 160 has a plurality of screw threads 161 which can be engaged with the screw threads 141 of the support wall 140 on the inner peripheral surface thereof. Also, the mount 160 has an aperture 162 at its center corresponding to the photosensing surface 111 of the image sensor die 110. The barrel 150 with a plurality of lenses 151 and an infrared blocking glass 152 is received in the aperture 162. Since the infrared blocking glass 152 is mounted in the barrel 150 in advance and screw connection is made on the outer peripheral surface of the support wall 140, there is a low probability that particles will lay on the infrared blocking glass 152 or the photosensing surface 111 of the image sensor die 110 when the mount 160 is coupled to the support wall 140. The image sensor package 100 can adjust the focus of the barrel 150 according to the turning of the mount 160. In other words, when the mount 160 is turned to be coupled to the support wall 140, it is possible to adjust the distance between the barrel 150 and the image sensor die 110 and the focus distance by controlling the turning of the mount 160.

At least one passive element 170 is provided on the electrically conductive patterns 124_1 formed on the first surface 121 of the substrate 120, i.e., the insulating layer 123, at the outer peripheral side of the support wall 140, thereby increasing the packaging density of the image sensor package 100. Also, at least one passive element 170 is provided on the electrically conductive patterns 124_1 at the inner peripheral side of the support wall 140 (not shown). A flexible circuit 180 is connected to the soldering portions, i.e., ball lands 127 of the electrically conductive patterns 124_2 formed on the second surface 122 of the insulating layer 123, by solders 190 so that the image sensor package 100 can be easily connected to an external device.

Figure 2:
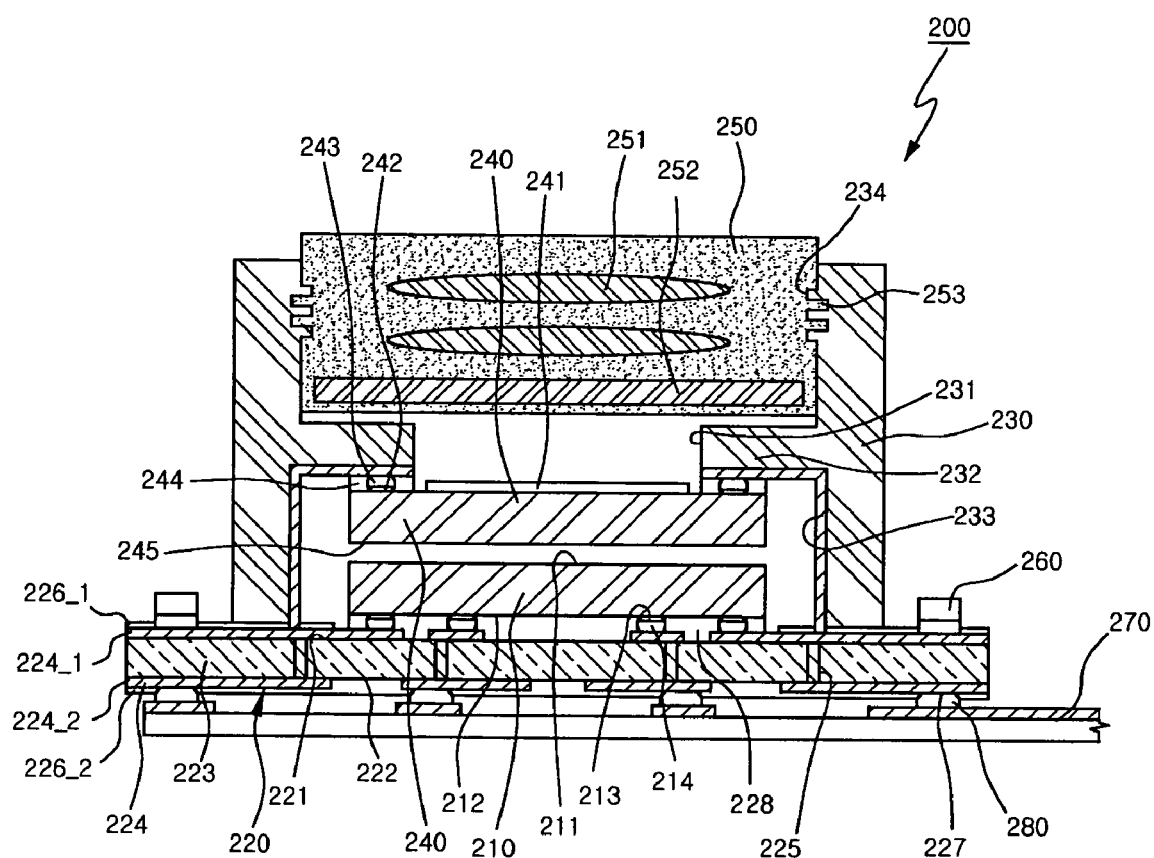
FIG. 2 is a cross-sectional view of an image sensor package constructed in accordance with another embodiment of the present invention.

Referring to FIG. 2, a cross-sectional view of an image sensor package 200 constructed in accordance with another embodiment of the present invention is illustrated.

As shown in the drawing, the image sensor package 200 comprises a semiconductor die 210, a substrate 220 electrically connected to the semiconductor die 210, a mount 230 adhered to the substrate 220 at the peripheral side of the semiconductor die 210, an image sensor die 240 electrically connected to the mount 230 and a barrel 250 engaged into the mount 230 above the image sensor die 240.

The semiconductor die 210 has an approximately or completely planar first surface 211 and an approximately or completely planar second surface 212 on the opposite side thereof. A plurality of bond pads 213 is formed on the second surface 212. A conductive bump 214 is bonded to each bond pad 213. The conductive bump 214 can be made of, and is not limited to, gold (Au), silver (Ag), solder (Sn/Pb) or an equivalent thereof. The semiconductor die 210 can be a DSP (Digital Signal Processor) or a memory. Since the semiconductor die 210 is provided in addition to the image sensor die 240, modularization of the image sensor package 200 can be achieved.

The substrate 220 includes an insulating layer 223 having two opposing surfaces, i.e., a first surface 221 and a second surface 222 which are approximately or completely planar. A plurality of electrically conductive patterns 224_1 is formed on the first surface 221 of the insulating layer 223. Also, a plurality of electrically conductive patterns 224_2 is formed on the second surface 221. The electrically conductive patterns 224_1 and 224_2 are connected by conductive vias 225 which penetrate into the insulating layer 223. The conductive bumps 214 of the semiconductor die 210 are electrically connected to the electrically conductive patterns 224_1. The first surface 221 and the electrically conductive patterns 224_1, excluding the portions connected to the conductive bumps 214, are coated with a first protective layer 226_1. Also, the second surface 222 and the electrically conductive patterns 224_2, excluding the soldering portions, are coated with a second protective layer 226_2. The soldering portions refer to ball lands 227.

Further, an underfill 228 is filled between the semiconductor die 210 and the substrate 220 in order to improve the mechanical bond strength between the semiconductor die 210 and the substrate 220 and prevent the corrosion of the conductive bumps 214.

The mount 230 having a predetermined height is fixed to the substrate 220 at the peripheral side of the semiconductor die 210, i.e., to the first protective layer 226_1 of the insulating layer 223. The mount 230 includes a support plate 232 which extends inward to a predetermined length and which has an aperture 231 of a predetermined diameter at the center thereof. The diameter of the aperture 231 of the support plate 232 is equal to or greater than a photosensing surface 241 of the image sensor die 240. An electrically conductive pattern 233 is formed on the lower surface of the support plate 232 and the inner wall of the mount 230 below the support plate 232. The electrically conductive pattern 233 is electrically connected to the electrically conductive patterns 224 (electrically conductive patterns 224_1, 224_2) of the substrate 220. In addition, a plurality of screw threads 234 is formed on the inner wall of the mount 230 above the support plate 232.

The image sensor die 240 has an approximately or completely planar photosensing surface 241, which receives external light and converts the light into an electrical signal. A plurality of bond pads 242 are formed on the image sensor die 240 at the peripheral side of the photosensing surface 241. Also, a plurality of conductive bumps 243 which are electrically connected to the electrically conductive pattern 233 of the support plate 232 are formed on the bond pads 242. In order to improve the mechanical bond strength between the image sensor die 240 and the support plate 232 and prevent the corrosion of the conductive bumps 243, an underfill 244 is filled between the image sensor die 240 and the support plate 232. In addition, the image sensor die 240 has an approximately or completely planar non-photosensing surface 245 on the side opposite to the photosensing surface 241 and the bond pads 242. The non-photosensing surface 245 of the image sensor die 240 is spaced at a predetermined distance from the first surface 211 of the semiconductor die 210.

The barrel 250 includes a plurality of lenses 251 and an infrared blocking glass 252 therein. A plurality of screw threads 253 formed at the outer peripheral surface of the barrel 250 can be engaged with screw threads 234 of the mount 230. Accordingly, it is possible to adjust the focus distance between the barrel 250 and the image sensor die 240 by turning the barrel 250 in a predetermined direction.

In addition, at least one passive element 260 is provided on the electrically conductive patterns 224_1 formed on the first surface 221 of the insulating layer 223 at the outer peripheral side of the mount 230, thereby increasing the packaging density of the image sensor package 200. Also, a flexible circuit 270 is further connected to the ball land 227 of each electrically conductive pattern 224_2 formed on the second surface 222 of the insulating layer 223 by a solder 280 so that the image sensor package 200 can be easily connected to an external device.

Referring to FIGS. 3A to 3H, an exemplary sequence of operations that may be used to facilitate the fabrication of the image sensor package of FIG. 1 is illustrated.

As shown in the above drawings, a method for manufacturing the image sensor package 100 comprises the operations of: providing an image sensor die 110, providing a substrate 120, connecting a passive element 170; fixing a support wall 140, attaching the image sensor die 110, bonding wires 130, connecting a mount 160 having a barrel 150 mounted therein and connecting a flexible circuit 180.

Figure 3A:
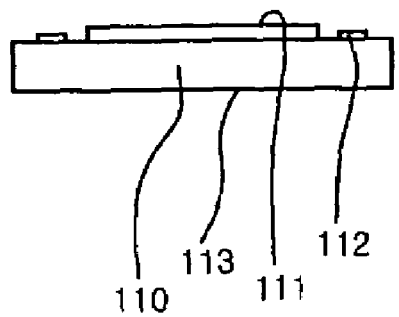
FIGS. 3A to 3H illustrate an exemplary sequence of operations that may be used to facilitate the fabrication of the image sensor package of FIG. 1.

FIG. 3A shows the operation of providing the image sensor die 110.

As shown in the drawing, the image sensor die 110 has an approximately or completely planar photosensing surface 111, which receives external light and converts the light into an electrical signal. A plurality of bond pads 112 is formed at the peripheral side of the photosensing surface 111. Also, an approximately or completely planar non-photosensing surface 113 is formed on the side opposite to the photosensing surface ill and the bond pads 112.

Figure 3B:
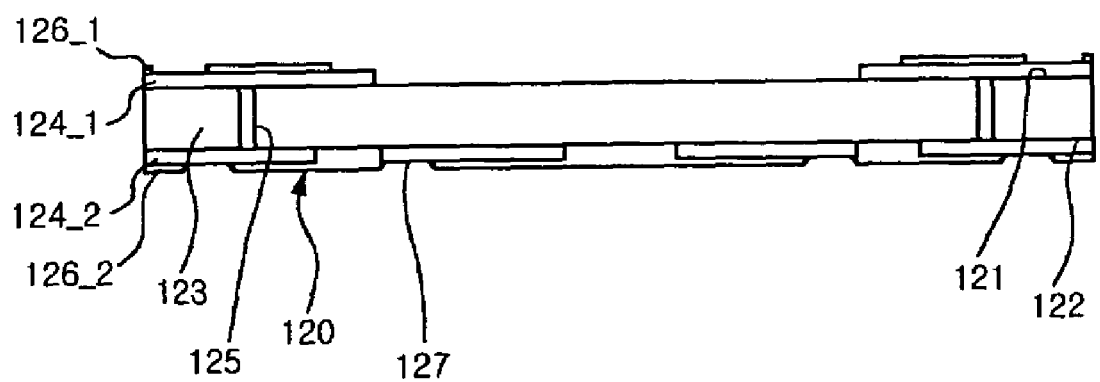

FIG. 3B shows the operation of providing the substrate 120.

As shown in the drawing, the substrate 120 includes an insulating layer 123 having an approximately or completely planar first surface 121 to which the non-photosensing surface 113 of the image sensor die 110 is adhered by means of an adhesive 114 and an approximately or completely planar second surface 122 on the opposite side thereof. A plurality of electrically conductive patterns 124_1 is formed on the first surface 121 of the insulating layer 123. Also, a plurality of electrically conductive patterns 124_2 is formed on the second surface 122. The electrically conductive patterns 124_1 and 124_2 are connected by conductive vias 125 which penetrate into the insulating layer 123. The first surface 121 and the electrically conductive patterns 124_1, excluding the wire bonding portions, are coated with the first protective layer 126_1. Also, the second surface 122 and the electrically conductive patterns 124_2, excluding the soldering portions, are coated with the second protective layer 126_2. The soldering portions refer to ball lands 127.

Figure 3C:
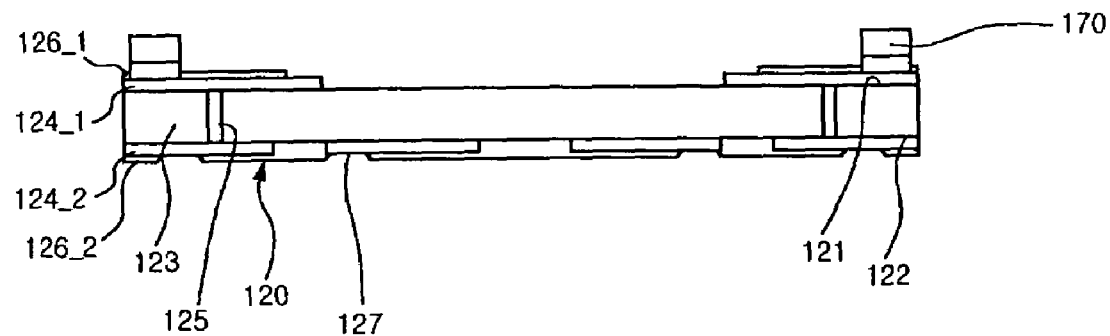

FIG. 3C shows the operation of connecting the passive element 170.

As shown in the drawing, at least one passive element 170 is provided on the electrically conductive patterns 124_1 formed on the first surface 121 of the insulating layer 123 at the outer peripheral side of the support wall 140. Since the passive element 170 is not located in an external device to which the image sensor package is connected, but formed in the image sensor package itself, the packaging density of the image sensor package can be increased.

Figure 3D:
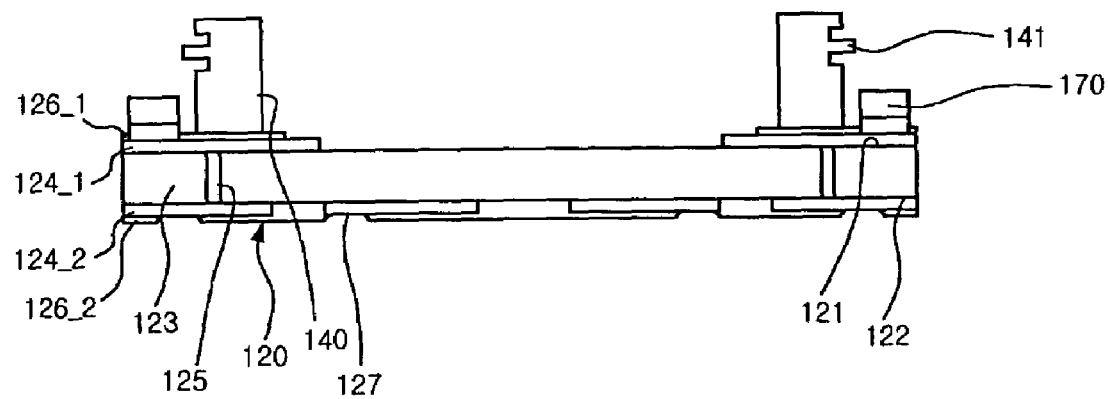

FIG. 3D shows the operation of fixing the support wall 140.

As shown in the drawing, the support wall 140 having a predetermined height is secured onto the first protective layer 126_1 of the substrate 120, i.e., insulating layer 123. Also, the support wall 140 has a plurality of screw threads 141 at the outer peripheral surface thereof.

Figure 3E:
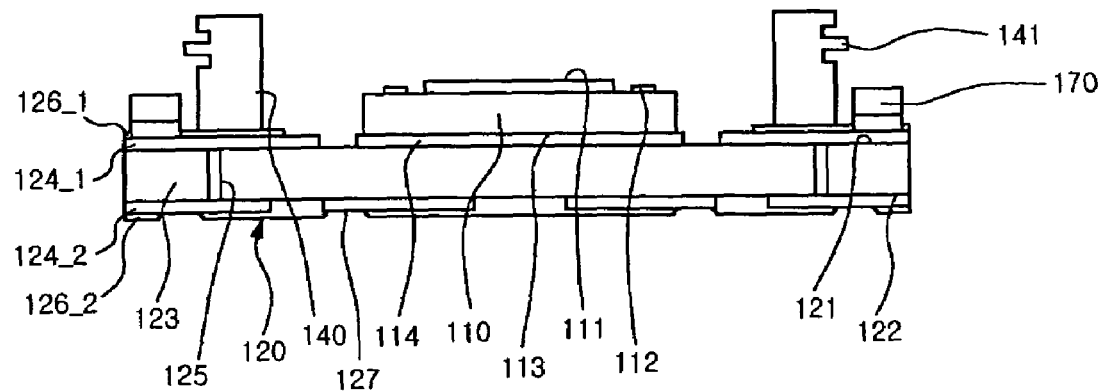

FIG. 3E shows the operation of attaching the image sensor die 110.

As shown in the drawing, the image sensor die 110 is attached to the first surface 121 of the insulating layer 123 inside the support wall 140 formed on the substrate 120 by the adhesive 114 provided on the non-photosensing surface 113.

Figure 3F:
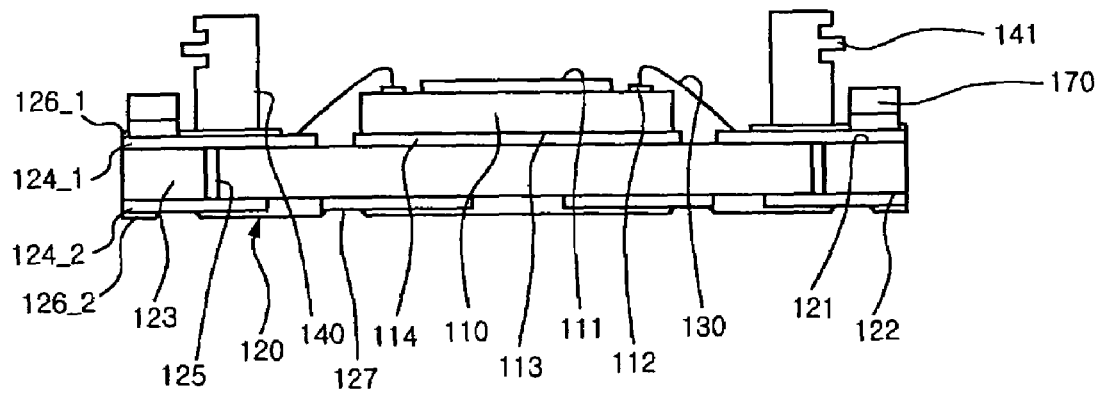

FIG. 3F shows the operation of bonding the wires 130.

As shown in the drawing, the plurality of bond pads 112 formed on the image sensor die 110 are electrically connected to the plurality of electrically conductive patterns 124_1 formed on the first surface 121 of the insulating layer 123 of the substrate 120 by the plurality of conductive wires 130.

Figure 3G:
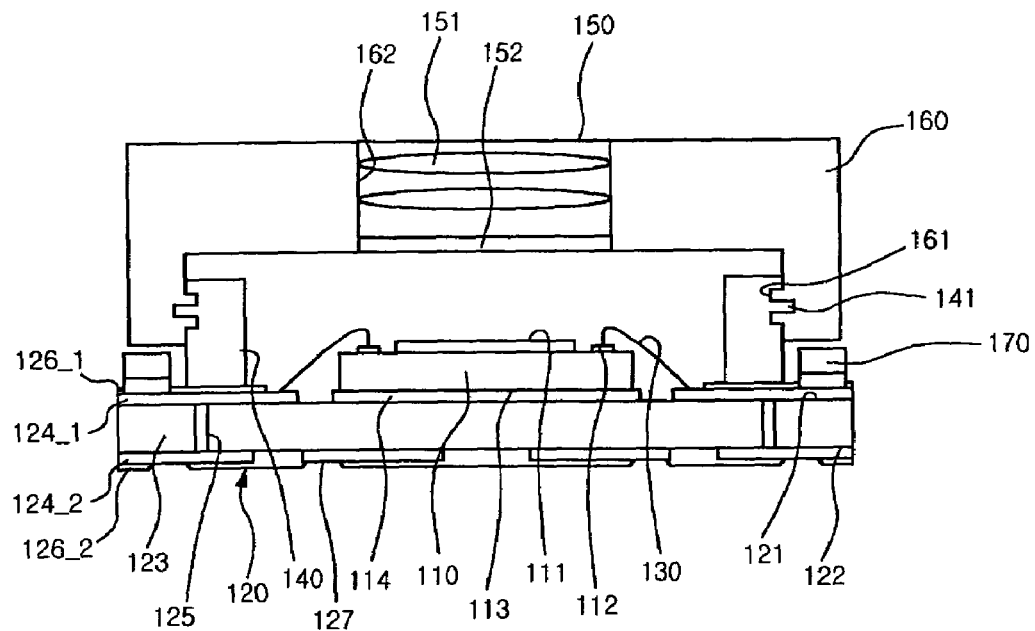

FIG. 3G shows the operation of connecting the mount 160 with the barrel 150 mounted therein.

As shown in the drawing, the mount 160 has a plurality of screw threads 161 at the inner peripheral surface thereof to be engaged with the screw threads 141 formed at the outer peripheral surface of the support wall 140. Also, the mount 160 has an aperture 162 at its center corresponding to the photosensing surface 111 of the image sensor die 110. The barrel 150 having a plurality of lenses 151 and an infrared blocking glass 152 is received in the aperture 162. The mount 160 can be tightly coupled to the support wall 140 if turned sufficiently in a predetermined direction. It is possible to optimize the focus distance between the barrel 150 and the image sensor die 110 by appropriately turning the mount 160.

Figure 3H:
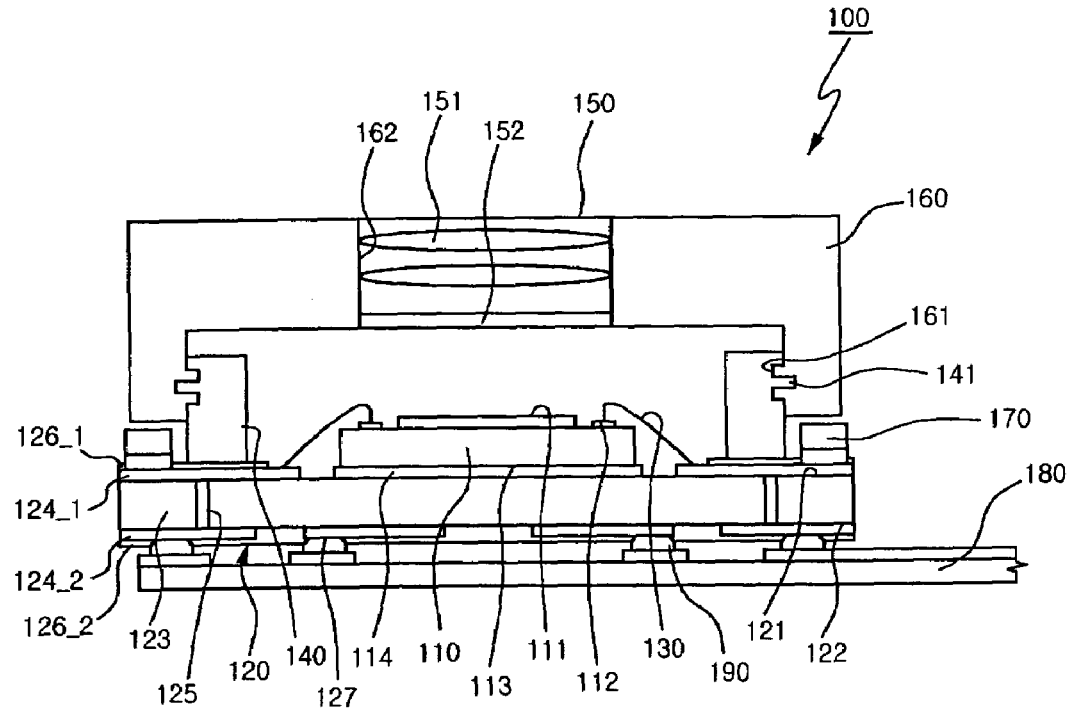

FIG. 3H shows the operation of connecting the flexible circuit 180.

As shown in the drawing, the flexible circuit 180 extending outward to a predetermined length is connected to the ball land 127 of each electrically conductive pattern 124_2 formed on the second surface 122 of the insulating layer 123 by a solder 190 so that the image sensor package 100 can be easily connected to an external device. The image sensor package 100 according to the present invention is thus completed. The flexible circuit 180 can be connected to an external device, such as a digital camera or a cellular phone.

Referring to FIGS. 4A to 4I, an exemplary sequence of operations that may be used to facilitate the fabrication of the image sensor package of FIG. 2 is illustrated.

As shown in the above drawings, a method for manufacturing the image sensor package 200 comprises the operations of: providing a semiconductor die 210 with a plurality of conductive bumps 214 attached thereto, providing a substrate 220, connecting a passive element 260, electrically connecting the semiconductor die 210 to the substrate 220, providing an image sensor die 240 having a photosensing surface 241 and a plurality of conductive bumps 243, providing a mount 230 with a support plate 232 and electrically connecting the mount 230 to the image sensor die 240, mounting the mount 230 over the substrate 220, mounting a barrel 250 into the mount 230 and connecting a flexible circuit 270.

Figure 4A:
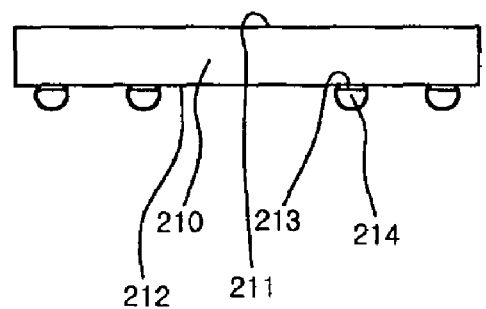
FIGS. 4A to 4I illustrate an exemplary sequence of operations that may be used to facilitate the fabrication of the image sensor package of FIG. 2.

FIG. 4A shows the operation of providing the semiconductor die 210.

As shown in the drawing, the semiconductor die 210 has an approximately or completely planar first surface 211 and an approximately or completely planar second surface 212 on the opposite side thereof. Also, a plurality of bond pads 213 is formed on the second surface 212. A conductive bump 214 is bonded to each bond pad 213.

Figure 4B:
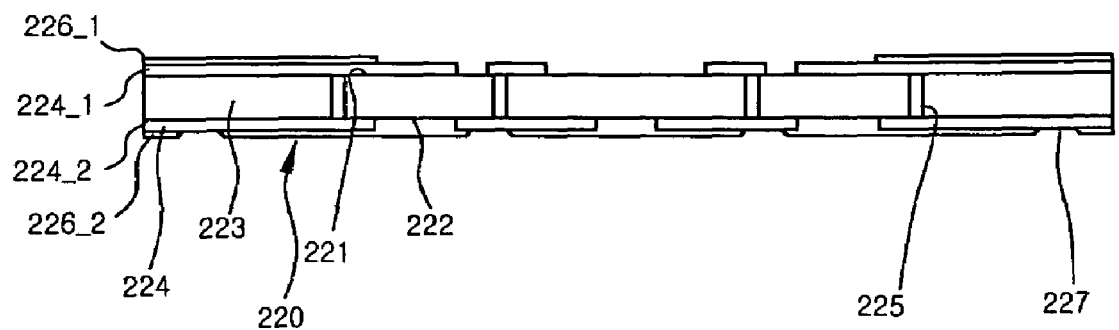

FIG. 4B shows the operation of providing the substrate 220.

As shown in the drawing, the substrate 220 includes an insulating layer 223 having two opposing surfaces, i.e., a first surface 221 and a second surface 222 which are approximately or completely planar. A plurality of electrically conductive patterns 224_1 is formed on the first surface 221 of the insulating layer 223. Also, a plurality of electrically conductive patterns 224_2 is formed on the second surface 221. The electrically conductive patterns 224_1 and 224_2 are connected by conductive vias 225 which penetrate into the insulating layer 223. The first surface 221 and the electrically conductive patterns 224_1, excluding the portions connected to the conductive bumps 214, are coated with the first protective layer 226_1. Also, the second surface 222 and the electrically conductive patterns 224_2, excluding the soldering portions, are coated with the second protective layer 226_2. The soldering portions refer to ball lands 227.

Figure 4C:
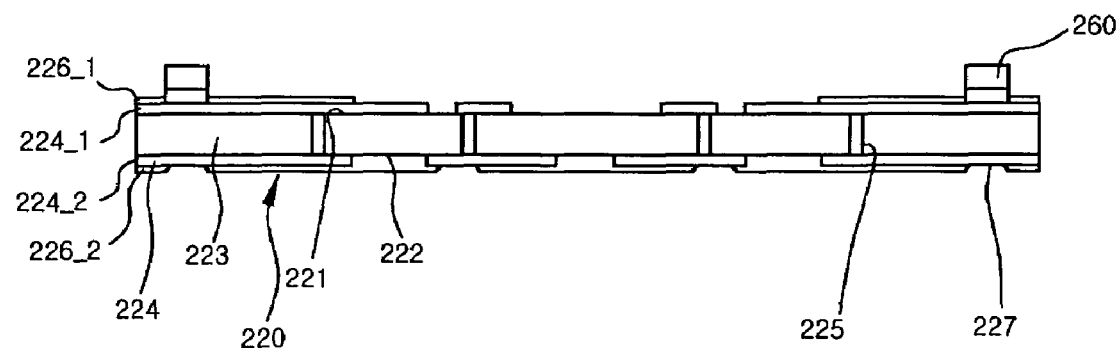

FIG. 4C shows the operation of connecting the passive element 260.

As shown in the drawing, at least one passive element 260 is provided on the electrically conductive pattern 224_1 formed on the first surface 221 of the insulating layer 223. Since the passive element 260 is not located in an external device to which the image sensor package is connected, but formed in the image sensor package itself, the packaging density of the image sensor package can be increased.

Figure 4D:
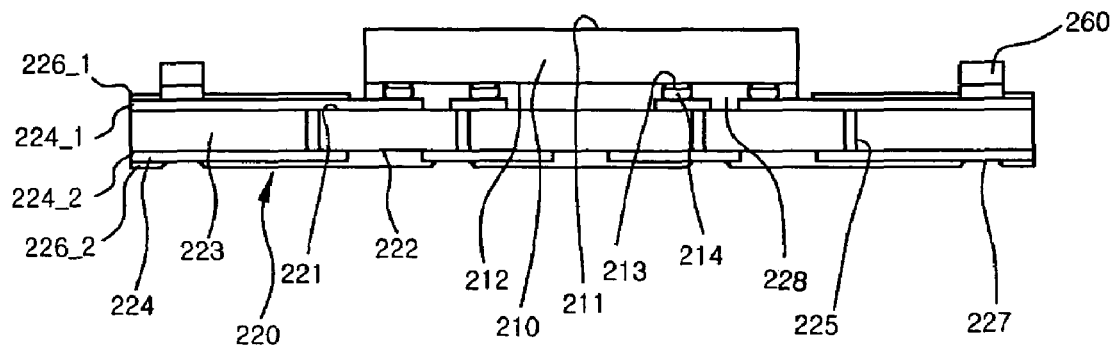

FIG. 4D shows the operation of connecting the semiconductor die 210.

As shown in the drawing, the conductive bumps 214 attached to the semiconductor die 210 are placed to be in contact with the electrically conductive patterns 224_1 formed on the first surface 221 of the insulating layer 223 and then secured onto the electrically conductive patterns 224_1 by reflowing. Subsequently, an underfill 228 is filled between the semiconductor die 210 and the substrate 220 in order to improve the mechanical bond strength between the semiconductor die 210 and the substrate 220 and prevent the corrosion of the conductive bumps 214.

Figure 4E:
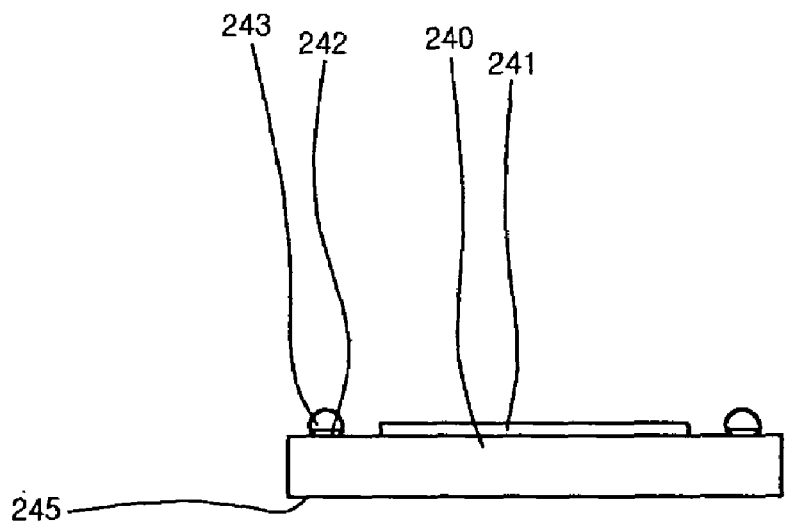

FIG. 4E shows the operation of providing the image sensor die 240.

As shown in the drawing, the image sensor die 240 has an approximately or completely planar photosensing surface 241, which receives external light and converts the light into an electrical signal. A plurality of bond pads 242 are formed on the image sensor die 240 at the peripheral side of the photosensing surface 241. Also, a plurality of conductive bumps 243 is formed on the bond pads 242. In addition, the image sensor die 240 has an approximately or completely planar non-photosensing surface 245 on the side opposite to the photosensing surface 241 and the bond pads 242.

Figure 4F:
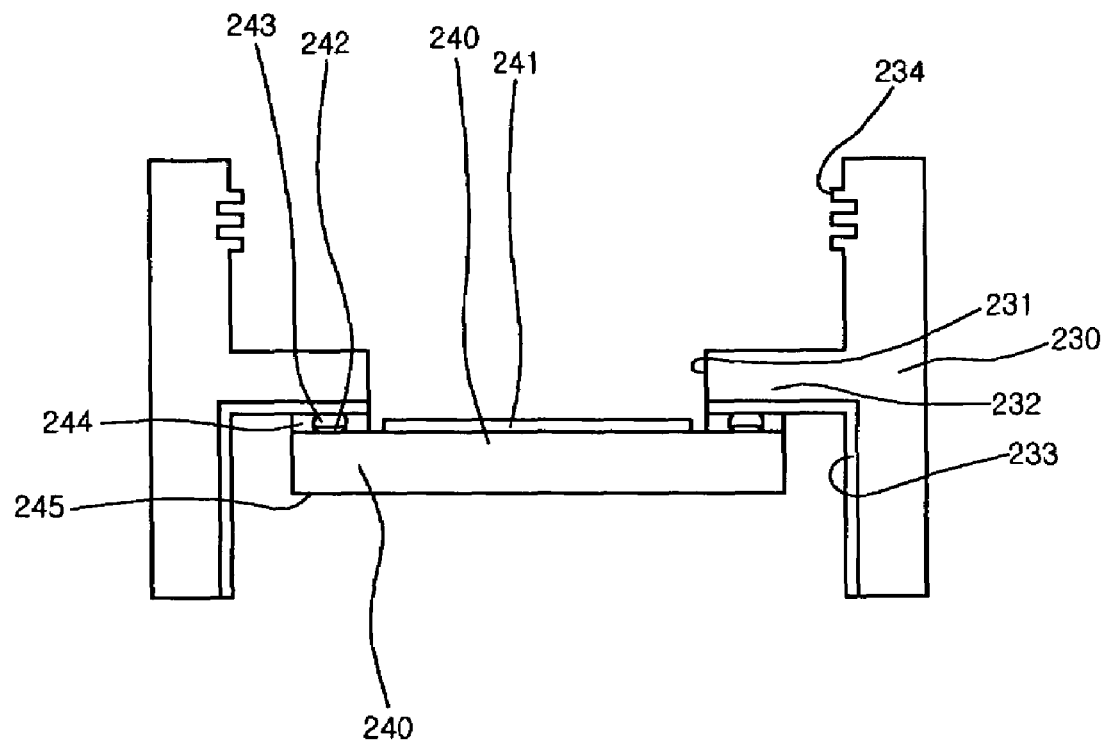

FIG. 4F shows the operation of providing the mount 230 and connecting the mount 230 to the image sensor die 240.

As shown in this drawing, the mount 230 has a substantially H-shaped cross-section. The mount 230 has a support plate 232 which extends inwardly to a predetermined length and which has an aperture 231 of a predetermined diameter at the center thereof. The diameter of the aperture 231 of the support plate 232 is equal to or greater than the photosensing surface 241 of the image sensor die 240. An electrically conductive pattern 233 is formed on the lower surface of the support plate 232 and the inner wall of the mount 230 below the support plate 232. In addition, a plurality of screw threads 234 is formed on the inner wall of the mount 230 above the support plate 232.

The conductive bumps 243 attached to the image sensor die 240 are placed to be in contact with the electrically conductive pattern 233 of the mount 230 and then fixed to the electrically conductive pattern 233 by reflowing. Subsequently, an underfill 244 is filled between the image sensor die 240 and the support plate 232 in order to improve the mechanical bond strength between the image sensor die 240 and the support plate 232 and prevent the corrosion of the conductive bumps 243.

Figure 4G:
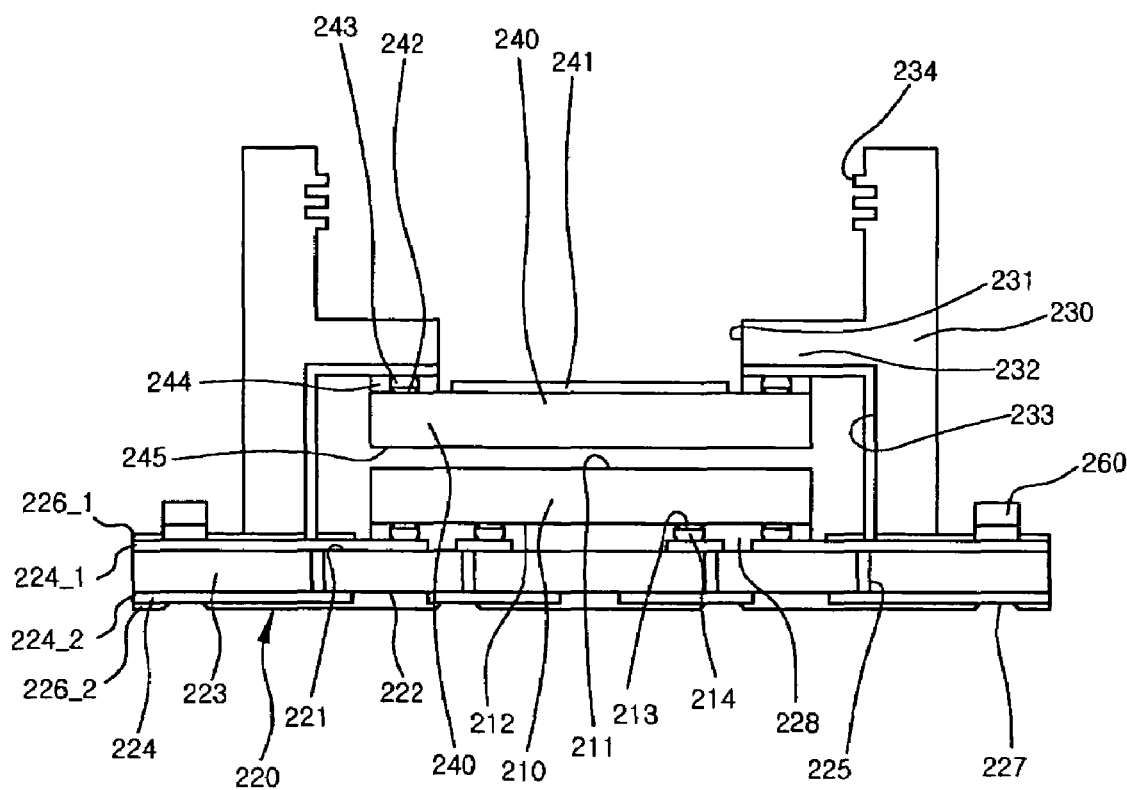

FIG. 4G shows the operation of mounting the mount 230 over the substrate 220.

As shown in the drawing, the mount 230 having a predetermined height is fixed to the substrate 220 at the peripheral side of the semiconductor die 210, i.e., to the first protective layer 226_1 of the insulating layer 223. The electrically conductive pattern 233 is electrically connected to the electrically conductive patterns 224-1 formed on the first surface 221 of the insulating layer 223.

Figure 4H:
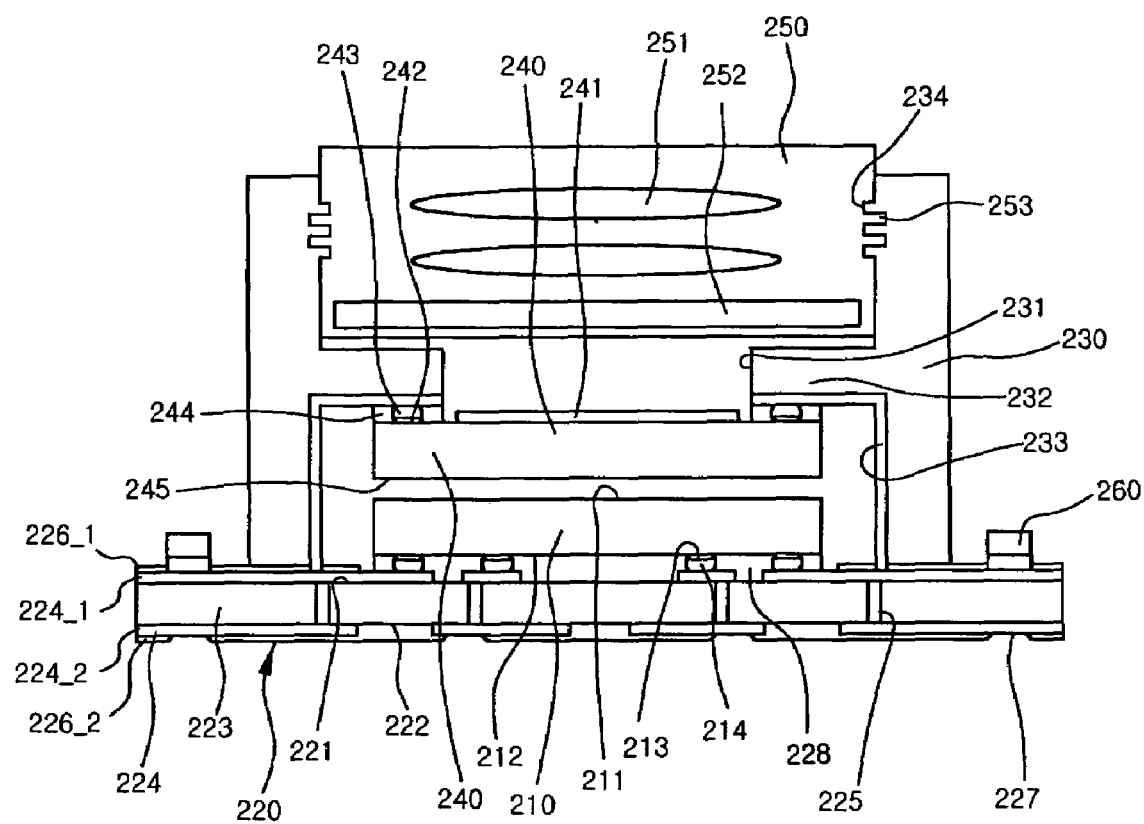

FIG. 4H shows the operation of mounting the barrel 250 into the mount 230.

As shown in the drawing, the barrel 250 has a plurality of screw threads 253 at the outer peripheral surface thereof to be engaged with the screw threads 234 formed at the inner periphery of the mount 230. The barrel 250 integrates a plurality of lenses 251 and an infrared blocking glass 252 therein. The barrel 250 is inserted into the mount 230 and turned sufficiently in a predetermined direction so that the screw threads 253 and 234 can be engaged with each other. It is possible to optimize the focus distance between the barrel 250 and the image sensor die 240 by appropriately turning the barrel 250.

Figure 4I:
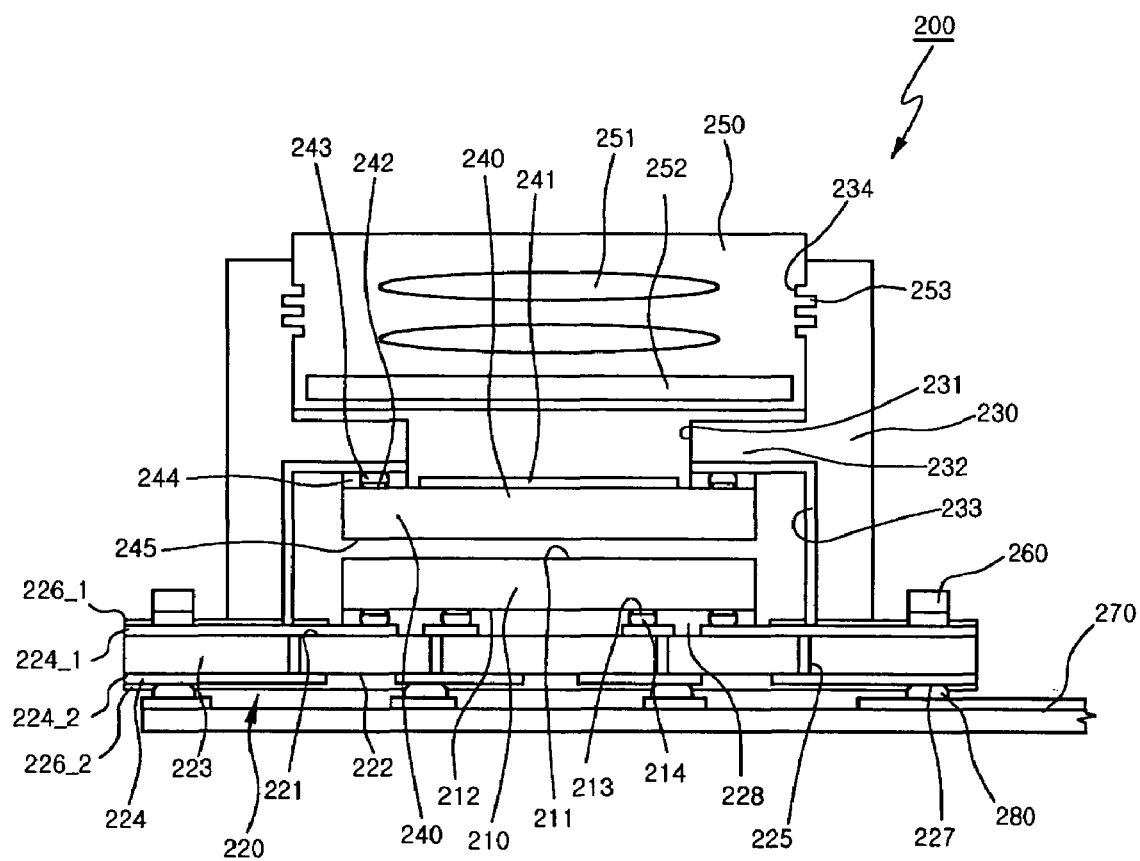

FIG. 4I shows the operation of connecting the flexible circuit 270.

As shown in the drawing, the flexible circuit 270 extending outward to a predetermined length is further connected to the electrically conductive patterns 224_2 formed on the second surface 222 of the insulating layer 223 by a solder 280 so that the image sensor package 200 can be easily connected to an external device. The image sensor package 200 according to the present invention is thus completed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. An image sensor package comprising:
   an image sensor die comprising an approximately or completely planar photosensing surface which receives external light and converts the received light into an electrical signal, a plurality of bond pads at the peripheral side of the photosensing surface, and an approximately or completely planar non-photosensing surface on the side opposite to the photosensing surface and the bond pads;
   a substrate comprising an insulating layer comprising an approximately or completely planar first surface to which the non-photosensing surface of the image sensor die is adhered by an adhesive and an approximately or completely planar second surface on the opposite side thereof, a plurality of electrically conductive patterns being formed on each of the first and second surfaces;
   a plurality of conductive wires electrically connecting the bond pads of the image sensor die to the electrically conductive patterns on the first surface of the insulating layer;
   a support wall on the first surface of the insulating layer of the substrate around the periphery of the conductive wires and comprising a plurality of screw threads on the outer peripheral surface thereof; and a mount comprising an aperture into which a barrel comprising a plurality of lenses is mounted.

2. The image sensor package as claimed in claim 1, wherein at least one passive element is further provided on the substrate at the outer peripheral side of the support wall.

3. The image sensor package as claimed in claim 1, wherein the barrel further includes an infrared blocking glass disposed below the plurality of lenses.

4. The image sensor package as claimed in claim 1, wherein a flexible circuit is connected to the electrically conductive patterns formed on the second surface of the insulating layer of the substrate.

5. The image sensor package as claimed in claim 1 wherein the mount comprises a plurality of screw threads on the outer peripheral surface of the mount.

6. The image sensor package as claimed in claim 5 wherein the screw threads of the mount are engaged with the screw threads of the support wall.

7. The image sensor package as claimed in claim 6 wherein a distance between the barrel and the image sensor die is adjusted by turning the mount.

8. An image sensor package comprising:
an image sensor die comprising:
 a photosensing surface;
 a plurality of bond pads at the photosensing surface; and
 a non-photosensing surface on the side opposite to the photosensing surface;
a substrate comprising:
 an insulating layer comprising a first surface and a second surface, the non-photosensing surface of the image sensor die being coupled to the first surface of the insulating layer; and
 a plurality of electrically conductive patterns being formed on each of the first and second surfaces;
a plurality of conductive wires electrically connecting the bond pads of the image sensor die to the electrically conductive patterns on the first surface of the insulating layer;
a support wall on the first surface of the insulating layer of the substrate around the periphery of the conductive wires and comprising a plurality of screw threads on the outer peripheral surface thereof;
a mount coupled to the screw threads of the support wall, the mount comprising an aperture; and
a barrel mounted into the aperture of the mount, the barrel comprising at least one lens.

9. The image sensor package as claimed in claim 8, wherein at least one passive element is further provided on the substrate at the outer peripheral side of the support wall.

10. The image sensor package as claimed in claim 8, wherein the barrel further includes an infrared blocking glass disposed below the at least one lens.

11. The image sensor package as claimed in claim 8 further comprising a flexible circuit connected to the electrically conductive patterns formed on the second surface of the insulating layer of the substrate.

12. The image sensor package as claimed in claim 8 wherein the mount comprises a plurality of screw threads on the outer peripheral surface of the mount.

13. The image sensor package as claimed in claim 12 wherein the screw threads of the mount are engaged with the screw threads of the support wall.

14. The image sensor package as claimed in claim 13 wherein a distance between the barrel and the image sensor die is adjusted by turning the mount.

15. The image sensor package as claimed in claim 8 wherein the substrate further comprises vias connecting the electrically conductive patterns formed on the first and second surfaces of the insulating layer.

16. The image sensor package as claimed in claim 8 wherein the electrically conductive patterns formed on the second surface of the insulating layer comprise ball lands.

17. The image sensor package as claimed in claim 16 further comprising solders on the ball lands.

18. The image sensor package as claimed in claim 17 further comprising a flexible circuit connected to the ball lands by the solders.

19. The image sensor package as claimed in claim 18 wherein the flexible circuit is for connection of the image sensor package to an external device.

20. An image sensor package comprising:
an image sensor die comprising:
 a photosensing surface;
 a plurality of bond pads at the photosensing surface; and
 a non-photosensing surface on the side opposite to the photosensing surface;
a substrate comprising:
 an insulating layer comprising a first surface and a second surface, the non-photosensing surface of the image sensor die being coupled to the first surface of the insulating layer;
 a plurality of electrically conductive patterns being formed on the first surface; and
 a plurality of electrically conductive patterns comprising ball lands being formed on the second surface;
a plurality of conductive wires electrically connecting the bond pads of the image sensor die to the electrically conductive patterns on the first surface of the insulating layer;
a support wall on the first surface of the insulating layer of the substrate around the periphery of the conductive wires and comprising a plurality of screw threads on the outer peripheral surface thereof;
a mount coupled to the screw threads of the support wall, the mount comprising an aperture;
a barrel mounted into the aperture of the mount, the barrel comprising at least one lens;
at least one passive element provided on the substrate at the outer peripheral side of the support wall; and
a flexible circuit connected to the ball lands by solders, the flexible circuit for connection of the image sensor package to an external device.

\* \* \* \* \*